United States Patent
Asai

(10) Patent No.: US 10,532,595 B2
(45) Date of Patent: Jan. 14, 2020

(54) PRINTING APPARATUS, METHOD FOR CONTROLLING SAME, AND STORAGE MEDIUM

(71) Applicant: CANON KABUSHIKI KAISHA, Tokyo (JP)

(72) Inventor: Hitoshi Asai, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/812,368

(22) Filed: Nov. 14, 2017

(65) Prior Publication Data

US 2018/0141357 A1 May 24, 2018

(30) Foreign Application Priority Data

Nov. 18, 2016 (JP) ................................ 2016-225373

(51) Int. Cl.
*B41J 29/38* (2006.01)
*H02J 50/12* (2016.01)
*H03F 3/217* (2006.01)

(52) U.S. Cl.
CPC ............ *B41J 29/38* (2013.01); *H02J 50/12* (2016.02); *H03F 3/2176* (2013.01); *H03F 2200/391* (2013.01)

(58) Field of Classification Search
CPC .. B41J 29/38; B41J 29/393; B41J 2029/3937; H02J 50/12; H03F 2200/391; H03F 3/2176

USPC .................................................... 347/5, 9, 19
See application file for complete search history.

(56) References Cited

U.S. PATENT DOCUMENTS

| 2015/0273895 | A1* | 10/2015 | Otsuka | B41J 11/0035 347/16 |
|---|---|---|---|---|
| 2015/0343814 | A1 | 12/2015 | Otsuka | |
| 2016/0094046 | A1* | 3/2016 | Kato | H02J 5/005 307/104 |

FOREIGN PATENT DOCUMENTS

| CN | 104290448 A | 1/2015 |
|---|---|---|
| CN | 104943363 A | 9/2015 |
| CN | 105471121 A | 4/2016 |
| CN | 105958661 A | 9/2016 |
| JP | 2008-055855 A | 3/2008 |
| JP | 2015-182346 A | 10/2015 |
| JP | 2015-223798 A | 12/2015 |
| JP | 2015-223799 A | 12/2015 |
| JP | 2015-223800 A | 12/2015 |
| JP | 2015-223804 A | 12/2015 |

* cited by examiner

*Primary Examiner* — Jannelle M Lebron
(74) *Attorney, Agent, or Firm* — Canon U.S.A., Inc. IP Division

(57) ABSTRACT

A printing apparatus includes a discharge unit that discharges ink onto a print medium based on print data, a power transmission unit that to wirelessly supplies power to the discharge unit for discharging the ink, and a control unit that controls the power to be supplied by the power transmission unit based on the print data.

15 Claims, 10 Drawing Sheets

FRONT VIEW

FIG.5

| NUMBER OF INK DROPLETS DISCHARGED DURING ONE SCAN | POWER TRANSMISSION VOLTAGE VDD |
|---|---|
| – THRESHOLD 1 | VOLTAGE Va |
| THRESHOLD 1 – THRESHOLD 2 | VOLTAGE Vb |
| THRESHOLD 2 – THRESHOLD 3 | VOLTAGE Vc |
| THRESHOLD 3 – | VOLTAGE Vd |

FIG.9

| PRINTING METHOD | | POWER TRANSMISSION VOLTAGE VDD |
|---|---|---|
| COLOR MODE | PRINT QUALITY | |
| MONOCHROME PRINTING | STANDARD | VOLTAGE Va |
| COLOR PRINTING | FINE | VOLTAGE Vb |
| MONOCHROME PRINTING | FINE | VOLTAGE Vc |
| COLOR PRINTING | STANDARD | VOLTAGE Vd |

PRINTING APPARATUS, METHOD FOR CONTROLLING SAME, AND STORAGE MEDIUM

BACKGROUND

Field

The present disclosure relates to a printing apparatus including a wireless power transmission apparatus, and a method for controlling the same.

Description of the Related Art

Inkjet printers configured so that an ink head for discharging ink and a driving circuit for driving the ink head are mounted on a carriage movable with respect to a housing have been conventionally known. Some small-sized inkjet printers even have an ink tank mounted on a carriage. In such printers, to supply power needed for the operation of the ink head mounted on the carriage, a power supply arranged outside the carriage and the carriage are connected by physical wiring, such as a flexible flat cable (FFC).

In such printers, printing is performed by the carriage making a reciprocating motion with respect to a print medium, such as paper, while discharging ink in synchronization with the reciprocating motion. The repetition of such a reciprocating motion can wear and break the FFC connecting the carriage and the power supply. In view of the circumstances, Japanese Patent Application Laid-Open No. 2015-223804 discusses a technique for introducing a wireless power transmission technique to wirelessly supply power to the carriage and make the FFC wireless.

Japanese Patent Application Laid-Open No. 2015-223804 does not take into consideration a power transmission control according to the state of the printer. For example, the amount of discharged ink varies with data to be printed by the printer (hereinafter, print data). Driving power (power consumption) of the ink head therefore varies depending on the print data. Without a power transmission control suited to the power consumption that varies based on the state of the printing apparatus such as the driving power of the ink head, wasteful power consumption can occur. In addition, heat or radiation noise from power failed to be transmitted can also occur. These issues are also applicable in printing apparatuses other than inkjet printers where a recording unit is moved by a carriage.

SUMMARY

According to an aspect of the present disclosure, a printing apparatus includes a discharge unit configured to discharge ink onto a print medium based on print data, a power transmission unit configured to wirelessly supply power to the discharge unit for discharging the ink, and a control unit configured to control the power to be supplied by the power transmission unit based on the print data.

Further features will become apparent from the following description of exemplary embodiments with reference to the attached drawings.

BRIEF DESCRIPTION OF THE DRAWINGS

FIG. 5 is a diagram illustrating a data configuration example of a VDD setting table according to the first exemplary embodiment.

FIG. 9 is a diagram illustrating a data configuration example of a VDD setting table according to the second exemplary embodiment.

DESCRIPTION OF THE EMBODIMENTS

Figure 1:
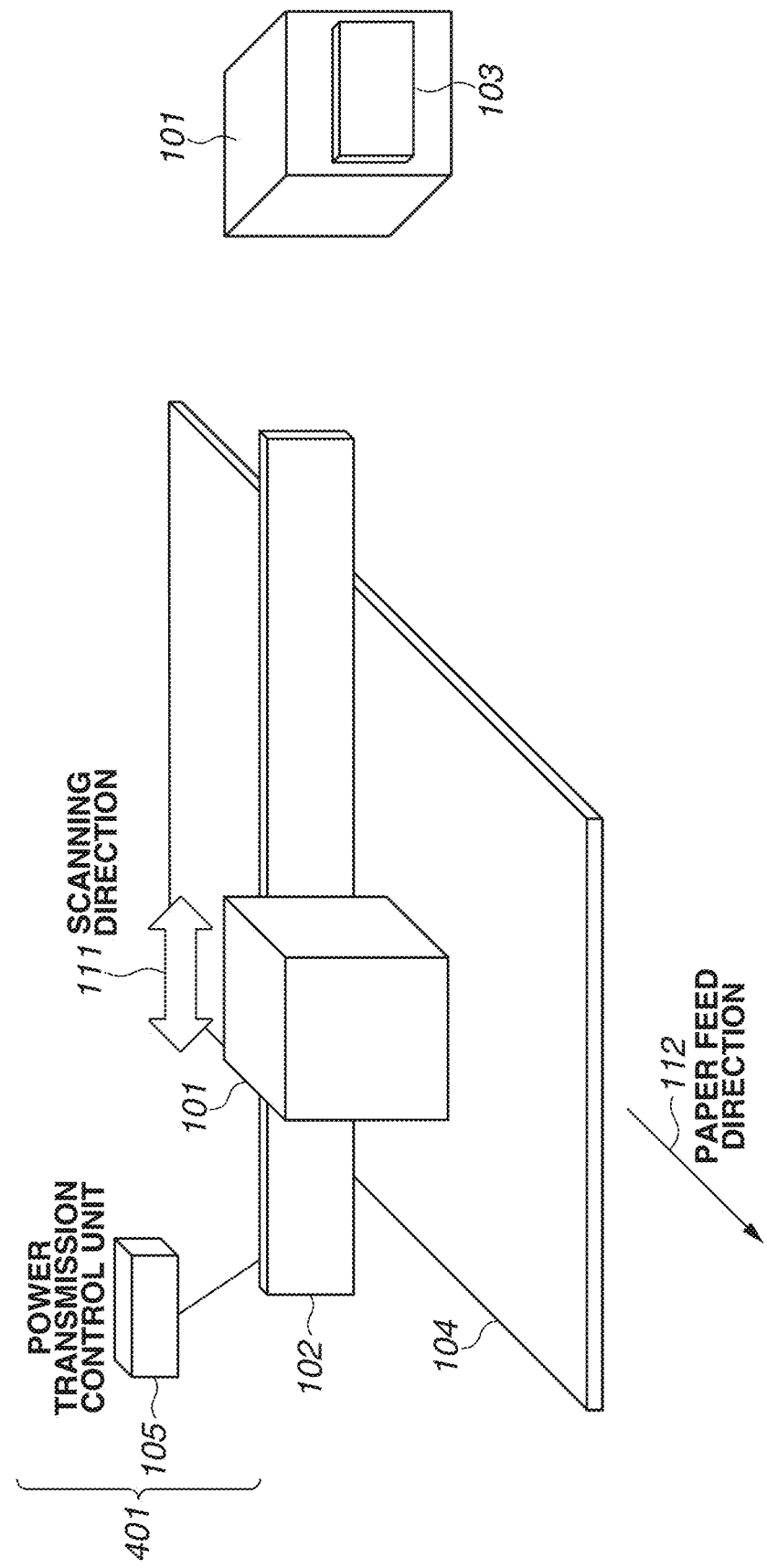
FIG. 1 is a perspective view of a configuration example of power transmission and reception antennas and a carriage according to an exemplary embodiment.

In an exemplary embodiment, a technique is described whereby a printing apparatus that provides power to its carriage via wireless power transmission performs power transmission control based on print data. Exemplary embodiments will be described with reference to the accompanying drawings.

Suppose that a Class E amplifier is used as a power transmitter of wireless power transmission. To maximize a direct-current-to-alternating-current conversion efficiency of the Class E amplifier, a zero voltage switching (ZVS) operation is needed. In general, an optimum load (load under which ZVS is achieved) RL connected with the Class E amplifier is expressed by the following equation:

$$RL = k \times VDD^2 / Pout \qquad (1),$$

where k is a coefficient determined by the amplification method, Pout is output power of the Class E amplifier, and VDD is a direct-current voltage input to the Class E amplifier. If a system impedance (hereinafter, design impedance) of the wireless power transmission system is designed to a 50-Ω system, the optimum load RL is desirably designed to be 50 Ω.

The optimum load RL of the Class E amplifier is determined by the output power Pout and the direct-current voltage VDD. This means that given a constant direct-current voltage VDD, the optimum load RL changes according to the output power Pout. In other words, if the Class E amplifier is used as the power transmitter of wireless power transmission and the power consumption of a load connected to the power receiver varies, the output power Pout varies and thus the optimum load RL varies. As a result, the optimum load RL deviates from the design impedance of the wireless power transmission system. Consequently, ZVS fails, and the transmission efficiency of the wireless power transmission system drops.

If a wireless power transmission technique using a Class E amplifier is introduced, transmission efficiency can drop depending on the driving power of an ink head. Since power failed to be transmitted is transformed into heat and radiation noise, components become larger in size and additional components may be needed, resulting in increased cost and space.

From the foregoing equation 1, it can be seen that even when the output power Pout varies, a change in the optimum load RL can be suppressed if the direct-current voltage (hereinafter, power transmission voltage) VDD can be appropriately controlled accordingly. In other words, if the power consumption of the load can be estimated, the output power Pout can be estimated from the estimated power consumption, and the power transmission voltage VDD can be controlled to achieve ZVS.

A first exemplary embodiment describes a wireless power transmission system of a printing apparatus that transmits power to its carriage using wireless power transmission using a Class E amplifier, in which a power transmission voltage VDD is appropriately controlled to achieve high-efficiency power transmission. In the wireless power transmission system according to the present exemplary embodiment, the voltage of the power transmission is controlled based on print data to be recorded by the carriage.

Figure 2:
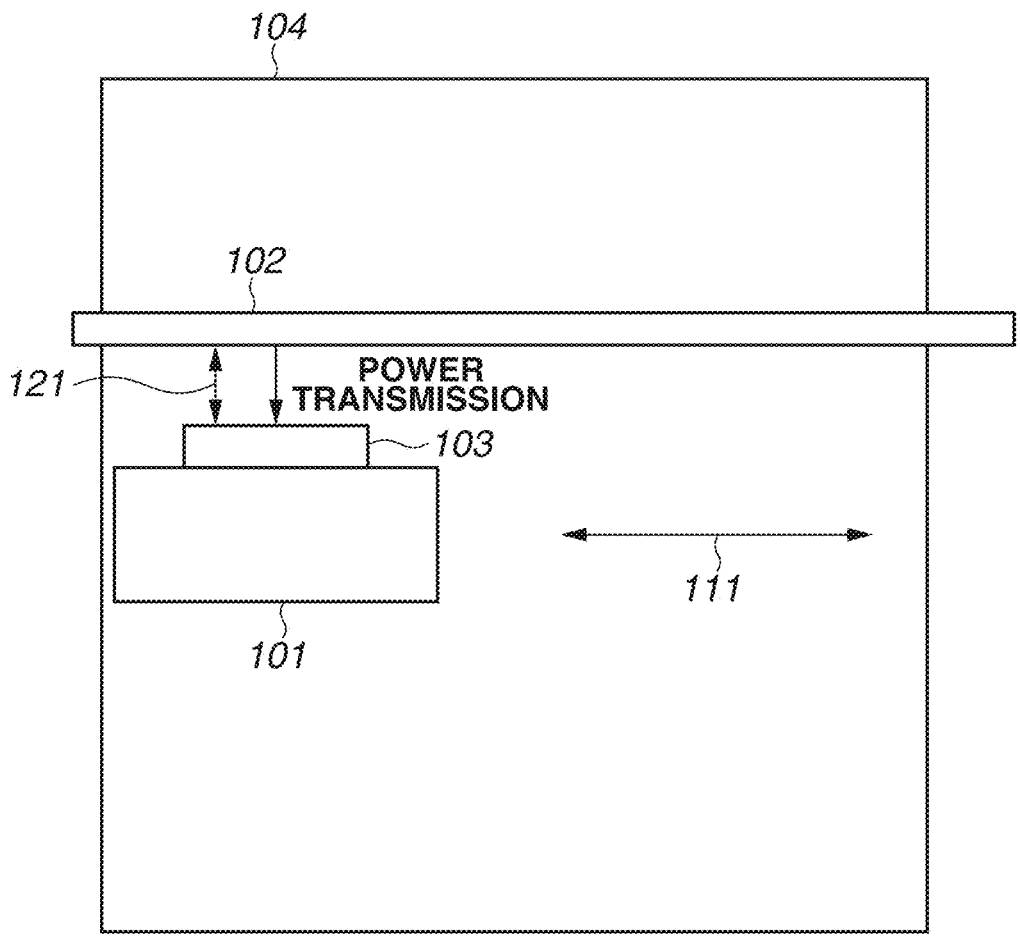
FIG. 2 is a top view of the configuration example of the power transmission and reception antennas and the carriage according to the exemplary embodiment.
Figure 3:
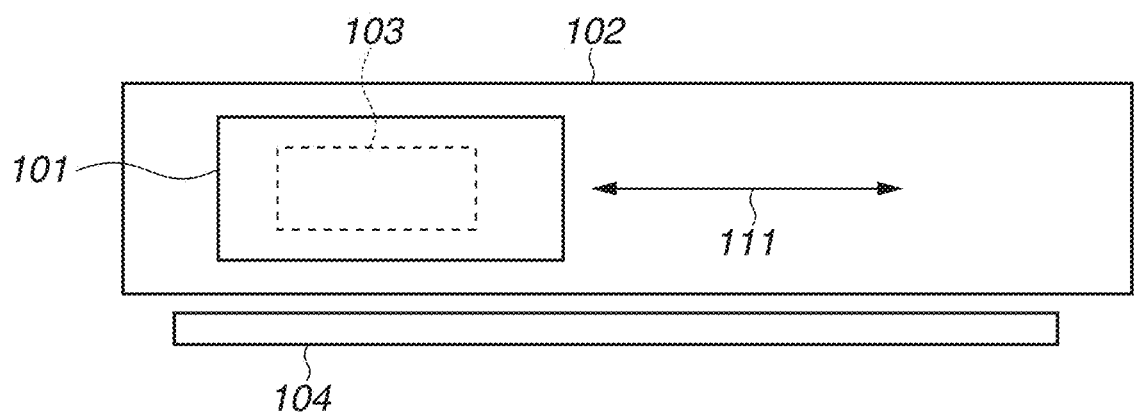
FIG. 3 is a front view of the configuration example of the power transmission and reception antennas and the carriage according to the exemplary embodiment.

A printing operation of the printing apparatus and a mode of implementation of power transmission and reception antennas of the wireless power transmission system according to the present exemplary embodiment will be described with reference to FIGS. 1, 2, and 3. FIGS. 1, 2, and 3 illustrate a perspective view, a top view, and a front view of the carriage with respect to the printing apparatus according to the present exemplary embodiment.

An ink head (recording unit) including a discharge unit for discharging ink to a print medium 104, such as paper, is mounted on a carriage 101. A power transmission antenna 102 wirelessly transmits power to the carriage 101. A power reception antenna 103 is provided on the carriage 101 and receives the power transmitted from the power transmission antenna 102. A power transmission control unit 105 performs wireless power transmission to the carriage 101 via the power transmission antenna 102. The power transmission control unit 105 and the power transmission antenna 102 constitute a power transmission unit 401. Printing is performed by conveying the print medium 104 in a conveyance direction 112 by a paper feed motor (not illustrated) while the ink head discharges ink in synchronization with a reciprocating motion of the carriage 101 in a scanning direction 111. The power reception antenna 103 receives the power transmitted from the power transmission antenna 102, and supplies the power internally to the carriage 101. The power transmission antenna 102 and the power reception antenna 103 are arranged so that a distance 121 (FIG. 2) between the antennas is substantially constant, regardless of which position the carriage 101 moves to.

Figure 4:
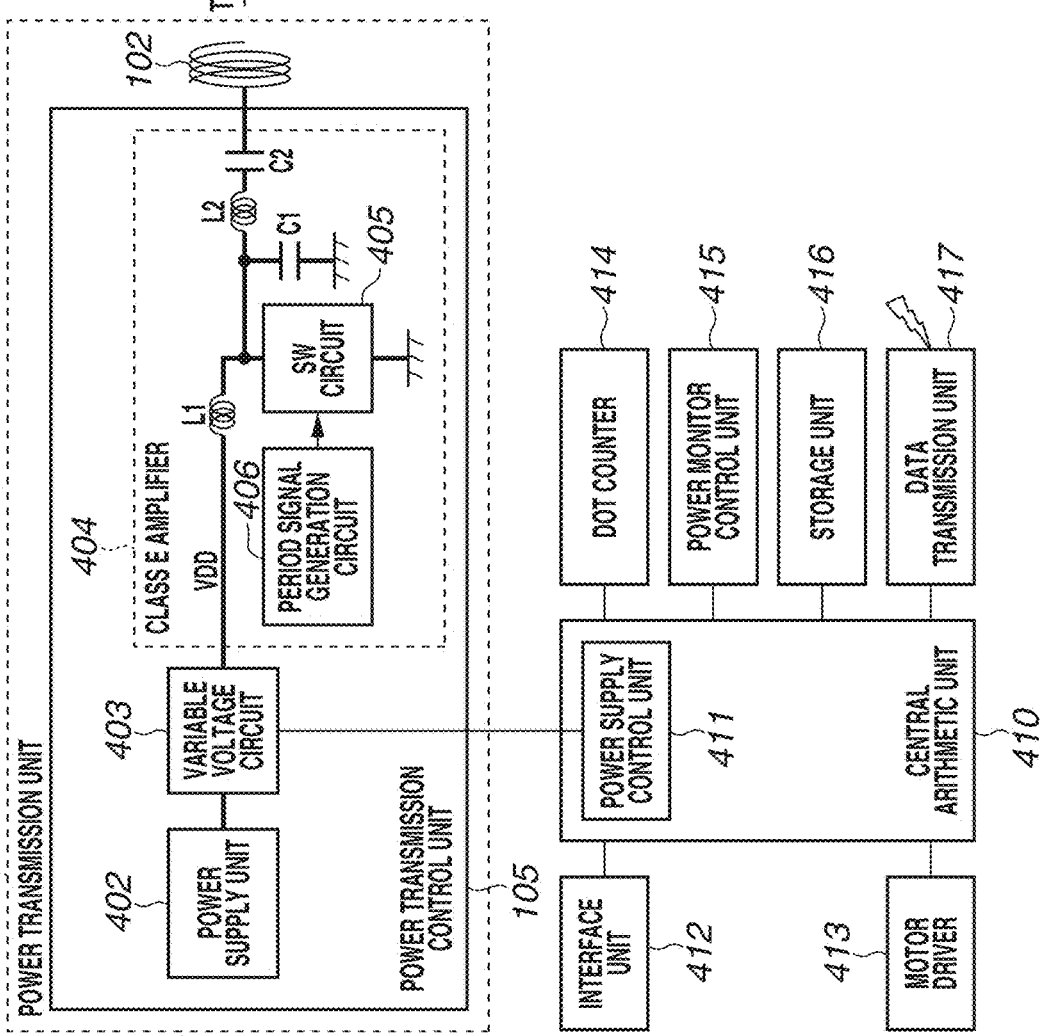
FIG. 4 is a block diagram illustrating a configuration example of a printing apparatus according to a first exemplary embodiment.

Next, an internal configuration of the printing apparatus will be described with reference to FIG. 4. FIG. 4 is a block diagram illustrating a control configuration example of the printing apparatus.

The power transmission unit 401 transmits power to the carriage 101 via wireless power transmission. The power transmission unit 401 includes a power supply unit 402, a variable voltage circuit 403, a Class E amplifier 404, and the power transmission antenna 102. The power supply unit 402 supplies a predetermined direct-current voltage. The variable voltage circuit 403 generates the power transmission voltage VDD from the predetermined direct-current voltage input thereto. The Class E amplifier 404 includes a switch (SW) circuit 405, a period signal generation circuit 406, inductors L1 and L2, and capacitors C1 and C2. An example of the SW circuit 405 is a metal-oxide-semiconductor field-effect transistor (MOSFET). The period signal generation circuit 406 generates a period signal for turning ON/OFF the SW circuit 405. The SW circuit 405 is turned ON/OFF to switch the input direct-current voltage, whereby an alternating-current voltage is generated. To maximize the direct-current-to-alternating-current conversion efficiency, the voltage applied to the SW circuit 405 (voltage between the ground (GND) and the node between the inductors L1 and L2) needs to be substantially 0 V and the gradient of the voltage needs to be substantially 0 as well when the SW circuit 405 is switched from OFF to ON. In other words, the conversion efficiency can be maximized by a ZVS operation.

A central arithmetic unit 410 controls operation of the printing apparatus. A power supply control unit 411 sets the power transmission voltage VDD of the variable voltage circuit 403 at an appropriate value according to print data. The power supply control unit 411 and the variable voltage circuit 403 control the voltage (power transmission voltage VDD) of power transmission by the power transmission unit 401 based on the print data to be recorded by the carriage 101. The power transmission unit 401 controls the power transmission voltage VDD and thereby controls the power transmitted to the carriage 101. An interface unit 412 includes the functions of connecting the printing apparatus to an external host apparatus, e.g., a personal computer or a smartphone, and receiving print data from the host apparatus. A motor driver 413 controls motors, including a carriage motor for implementing the reciprocating motion of the carriage 101 and a paper feed motor for conveying the print medium 104.

A dot counter 414 calculates the number of ink droplets to be discharged from the ink head from the print data. A power monitor control unit 415 prevents driving power of the ink head from increasing due to print data. If the number of ink droplets calculated by the dot counter 414 is greater than a predetermined threshold, the power monitor control unit 415 determines to perform multi-pass printing. In multi-pass printing, the amount of ink discharged per scan (hereinafter, one scan) is thinned to suppress instantaneous maximum power consumption of the ink head. This can suppress the settable range of VDD (variable range of the output voltage needed of the variable voltage circuit 403). A storage unit 416 stores a table in which a correspondence between the number of ink droplets to be discharged from the ink head and the voltage to be set for power transmission (VDD) is recorded. A data transmission unit 417 transmits data for ink discharge driving to the carriage 101 based on the print data received from the external host apparatus via the interface unit 412.

FIG. 5 is a diagram illustrating a data configuration example of the table stored in the storage unit 416. As illustrated in FIG. 5, thresholds of the number of ink droplets discharged during one scan and corresponding optimum power transmission voltages VDD are recorded in the table in association with each other according to the present exemplary embodiment. As described below, the number of ink droplets in the table is the number of ink droplets discharged in one scan of a divided area. Referring to the table, if the number of ink droplets<threshold 1, a voltage Va is selected as the power transmission voltage VDD. If threshold 1≤the number of ink droplets<threshold 2, a voltage Vb is selected as the power transmission voltage VDD. If threshold 2≤the number of ink droplets<threshold 3, a voltage Vc is selected as the power transmission voltage VDD. If the number of ink droplets≥threshold 3, a voltage Vd is selected as the power transmission voltage VDD. The power transmission voltages Va to Vd in the table are voltages such that the Class E amplifier 404 makes a ZVS operation under power consumption estimated to be needed to discharge as many ink droplets as the respective corresponding numbers.

The carriage 101 includes a power reception unit 450 that includes the power reception antenna 103 and a rectification unit 451. The power reception antenna 103 receives the power wirelessly transmitted from the power transmission antenna 102. The rectification unit 451 converts the alternating-current voltage received by the power reception antenna 103 into a direct-current voltage. A data reception unit 452 receives the data transmitted from the data transmission unit 417 using power supplied from the power reception unit 450. A driving circuit 453 drives an ink head 454. The driving circuit 453 controls discharge of the ink head 454 based on the data received by the data reception unit 452, and warms the ink head 454 using power supplied from the power reception unit 450. The ink head 454 discharges ink based on the data received by the data reception unit 452 using power supplied from the power reception unit 450. The elements needed for printing are not limited thereto, and various modes can be employed. The configuration and operation described in the present exemplary embodiment are merely examples.

Figure 6:
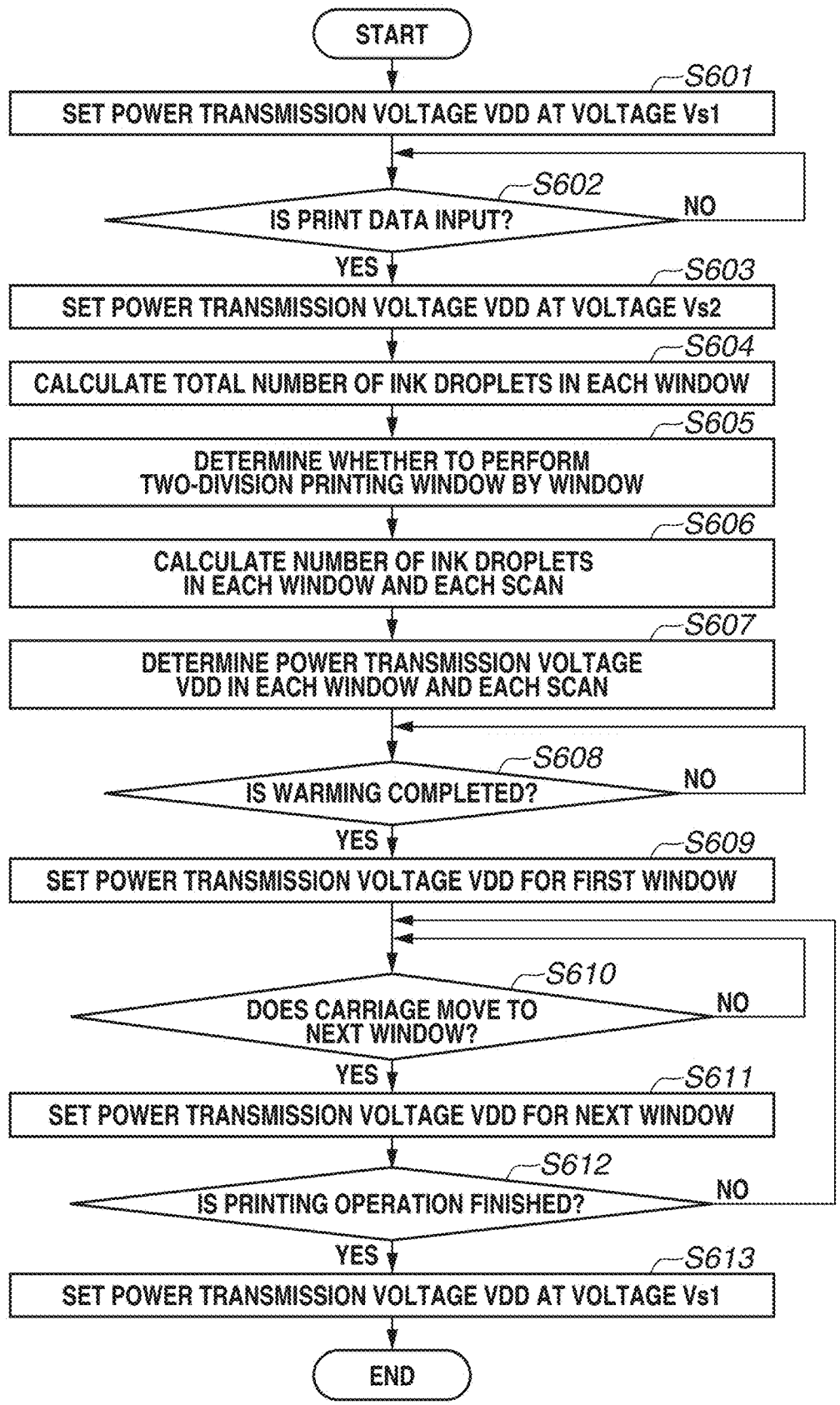
FIG. 6 is an operation flowchart according to the first exemplary embodiment.

Next, an operation of the wireless power transmission system according to the present exemplary embodiment will be described with reference to FIG. 6. The processing illustrated in FIG. 6 is repeated after power-on of the printing apparatus.

In step S601, the power supply control unit 411 sets the power transmission voltage VDD at a voltage Vs1. The voltage Vs1 is a power transmission voltage VDD suited to power consumption needed for a data reception operation when the printing apparatus is in standby. For example, the voltage Vs1 is a voltage value at which the Class E amplifier 404 substantially achieves ZVS mostly under power consumption of the data reception unit 452 in the carriage 101. High-efficiency wireless power transmission in a proper quantity is thus performed during standby. The period when the printing apparatus is on standby refers to a period in which the printing apparatus is powered on and waiting for receipt of print data. In step S602, the printing apparatus enters a state of waiting for print data from the external host apparatus. In a case where there is no print data input from the host apparatus (NO in step S602), the waiting state is maintained (the processing returns to step S602).

In a case where print data is input to the printing apparatus (YES in step S602), the processing proceeds to step S603. In step S603, the power supply control unit 411 sets the power transmission voltage VDD at a voltage Vs2. The central arithmetic unit 410 instructs the driving circuit 453 to warm the ink head 454 via the data transmission unit 417 and the data reception unit 452. More specifically, if the print data is received via the interface unit 412, the power supply control unit 411 sets the voltage for power supply (power transmission voltage VDD) at the voltage Vs2 according to power for warming the ink head 454. The power transmission voltage VDD is thereby set at a voltage value at which the Class E amplifier 404 substantially achieves ZVS under the power consumption for warming the ink head 454. High-efficiency power transmission in a proper quantity is thus performed in warming the ink head 454.

In steps S604 to S607, the power supply control unit 411 and the variable voltage circuit 403 control the voltage (power transmission voltage VDD) of power transmission by the power transmission unit 401 based on the number of ink droplets to be discharged from the ink head 454. The number of ink droplets to be discharged is determined based on the print data. In the present exemplary embodiment, to reflect the state of discharge of ink droplets on the control of the voltage for power transmission, the number of ink droplets to be discharged from the ink head 454 is determined in each of divided areas of the image to be formed by the print data, and the power transmission voltage VDD is controlled with respect to each divided area. In the present exemplary embodiment, a predetermined number of areas into which an area to be recorded by one scan of the carriage 101 is divided in the scanning direction are used as the divided areas.

In step S604, the dot counter 414 initially divides a range to be printed into a plurality of areas in the scanning direction and a sub scanning direction, and calculates a total number of ink droplets to be discharged from in the ink head 454 in each of the plurality of divided areas (hereinafter, windows). For example, the division granularity of the windows can be set to a lateral width of 1 inch and a vertical width corresponding to discharge ports (the number of nozzles) of the ink head 454.

In step S605, the power monitor control unit 415 compares, window by window, the number of ink droplets to be discharged by the ink head 454 with a predetermined threshold, and determines whether to perform multi-pass printing in which an operation of printing is divided and performed by a plurality of scans. In the present exemplary embodiment, the power monitor control unit 415 determines for each window whether to divide an operation of printing into two scans, or equivalently, whether to perform multi-pass printing. The power monitor control unit 415 determines a window in which the total number of ink droplets exceeds the threshold to be one in which to perform multi-pass printing. In step S606, the power supply control unit 411 calculates the number of ink droplets to be discharged from the ink head 454 in each window and each scan based on the number of ink droplets obtained in step S604 and the number of divisions (whether to perform multi-pass printing) determined in step S605. In step S607, the power supply control unit 411 refers to the table (FIG. 5) stored in the storage unit 416, and determines the power transmission voltage VDD in each window and each scan from the number of ink droplets in each window and each scan. In step S608, the power supply control unit 411 waits for the completion of the warming of the ink head 454, started in step S603.

Figure 7:
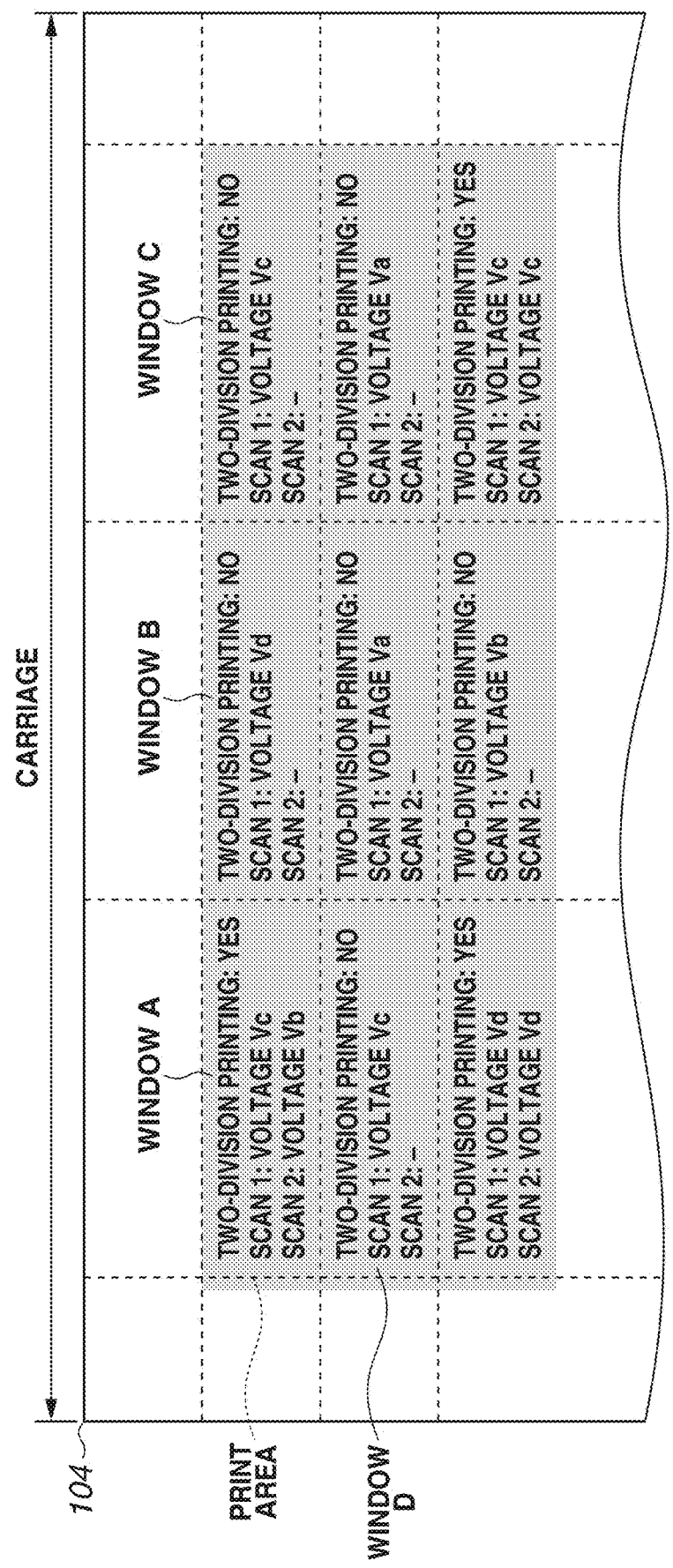
FIG. 7 is a diagram illustrating setting examples of a voltage for power transmission.

FIG. 7 illustrates examples of setting values of the power transmission voltage VDD determined by the foregoing operation based on print data. As illustrated in FIG. 7, a setting value of the power transmission voltage VDD is determined for each of the windows constituting a print area and for each scan of multi-pass printing. For example, in a window A, multi-pass printing is performed. The voltage Vc is set as the power transmission voltage VDD in the first scan, and the voltage Vb is set as the power transmission voltage VDD in the second scan.

In step S608, in a case where the warming of the ink head 454 is determined to be completed (YES in step S608), the processing proceeds to step S609. In step S609, the central arithmetic unit 410 transmits data to the carriage 101 via the data transmission unit 417 so that the carriage 101 starts a printing operation. During the printing operation, the power supply control unit 411 controls the variable voltage circuit 403 so that the power transmission voltage VDD becomes the voltage setting value determined in step S607.

In step S609, the power supply control unit 411 initially sets the power transmission voltage VDD at the voltage determined for the first window of printing. Referring to the example of FIG. 7, in the window A, which is the first window of printing, the power supply control unit 411 sets the power transmission voltage VDD at the voltage Vc for scan 1. In a case where the discharge in the window A is completed and the carriage 101 moves to the next window (window B) (YES in step S610), the processing proceeds to step S611. In step S611, the power supply control unit 411 sets the power transmission voltage VDD at the voltage Vd for the window B and scan 1. In a case where the discharge in the window B is completed and the carriage 101 moves to the next window (window C) (NO in step S612 and YES in step S610), the processing proceeds to step S611. In step S611, the power supply control unit 411 sets the power transmission voltage VDD at the voltage Vc for the window C and scan 1. In a case where the discharge in the window C is completed and the carriage 101 moves to the window A again for the second scan (NO in step S612 and YES in step S610), the processing proceeds to step S611. In step S611, the power supply control unit 411 sets the power transmission voltage VDD at the voltage Vb for the window A and scan 2. Such an operation is repeated until the printing ends.

In a case where the printing operation is finished (YES in step S612), the processing proceeds to step S613. In step S613, the power supply control unit 411 sets the power transmission voltage VDD to the voltage Vs1 again. The processing then ends.

As described above, according to the present exemplary embodiment, the power consumption in each window of the print data is estimated based on the calculated amount of ink to be discharged. The power transmission voltage VDD is controlled to maintain the ZVS operation of the Class E amplifier 404. In such a manner, high-efficiency power transmission can be performed in proper quantities.

In the present exemplary embodiment, the antennas are described to be configured so that the power transmission antenna 102 is arranged on the far side of the carriage 101 as seen from the near side, and the power reception antenna 103 is arranged on the back surface of the carriage 101 as seen from the near side. However, configuration is not limiting. For example, the power transmission antenna 102 can be arranged above or below the carriage 101, and the power reception antenna 103 can be arranged on the top or bottom surface of the carriage 101. The power transmission antenna 102 illustrated in FIG. 1 can be arranged on the near side of the carriage 101 as seen from the near side, and the power reception antenna 103 can be arranged on the front of the carriage 101 as seen from the near side. In the foregoing example, the power transmission and reception antennas 102 and 103 are arranged to be perpendicular to the conveyed print medium 104. However, this configuration is not limiting. For example, the power transmission antenna 102 can be arranged above or below the carriage 101 to be in parallel with the conveyed print medium 104. The power reception antenna 103 can be arranged on the top or bottom surface of the carriage 101. The power transmission and reception antennas 102 and 103 can be arranged at an angle, e.g., 45°. The power transmission antenna 102 can be configured to also serve as a guide for the reciprocating motion of the carriage 101.

In the present exemplary embodiment, the power supply control unit 411 is arranged inside the central arithmetic unit 410. However, the power supply control unit 411 can be configured to be arranged outside the central arithmetic unit 410. The dot counter 414 and the power monitor control unit 415 can be implemented by the central arithmetic unit 410.

In the present exemplary embodiment, the power monitor control unit 415 suppresses the maximum power consumption of the ink head 454 by performing multi-pass printing based on the number of ink droplets calculated by the dot counter 414. This is not seen to be limiting. For example, the power monitor control unit 415 can also implement multi-pass printing in which scanning is performed, for example, three or four times. The power monitor control unit 415 can use a technique for suppressing power consumption of components other than the ink head 454 in combination, like, for example, reducing the moving speed of the carriage 101.

In the present exemplary embodiment, the Class E amplifier 404 is described to be a single switching circuit including one SW circuit. This is not seen to be limiting. The Class E amplifier 404 can, for example, be a push-pull circuit including two SW circuits. The Class E amplifier 404 can be configured to include three or more SW circuits. In the present exemplary embodiment, the power transmission voltage VDD is set in four levels of resolution (voltages Va, Vb, Vc, and Vd) based on the amount of ink to be discharged. This is not seen to be limiting. The number of levels of resolution can be less than or greater than four. The finer the resolution, the more wasteful power consumption can be suppressed.

In the present exemplary embodiment, the setting values of the power transmission voltage VDD are described to be voltage values at which the Class E amplifier 404 substantially achieves ZVS. This is not seen to be limiting. Voltages different from the power transmission voltages VDD at which ZVS is achieved can be set as long as a drop in the transmission efficiency of the wireless power transmission system falls within an allowable range.

In the first exemplary embodiment, the power transmission voltage VDD is controlled based on the number of ink droplets to be discharged, determined by print data. In a second exemplary embodiment, a printing apparatus that transmits power to its carriage using wireless power transmission using a Class E amplifier achieves high-efficiency transmission by controlling the power transmission voltage VDD according to a printing method determined based on the print data.

Figure 8:
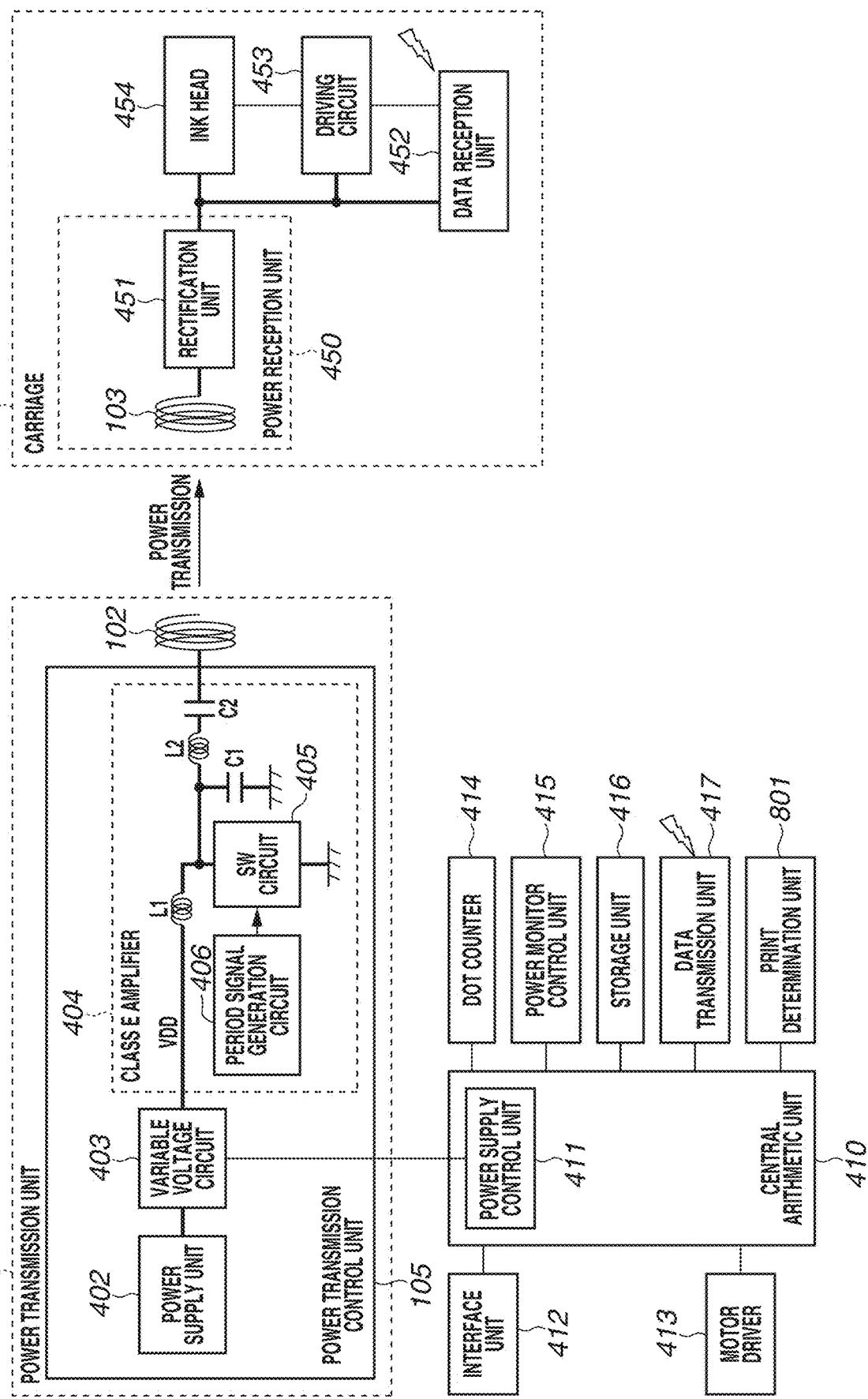
FIG. 8 is a block diagram illustrating a configuration example of a printing apparatus according to a second exemplary embodiment.

FIG. 8 is a block diagram illustrating a configuration example of the printing apparatus according to the second exemplary embodiment. Components similar to those of the first exemplary embodiment (FIG. 4) are designated by the same reference numerals. The main difference from the first exemplary embodiment is a print determination unit 801 and the storage unit 416 stores a table in which a correspondence between a printing method and a power transmission voltage is recorded. The print determination unit 801 determines a printing method of print data received from a host apparatus via the interface unit 412. In the present exemplary embodiment, printing methods using different color modes (monochrome printing/color printing) and print quality levels (standard/fine) will be described as examples. The print quality can be specified by print data. The user can specify the print quality from an operation panel of the printing apparatus.

A table describing a correspondence between printing methods specified by a host computer and power transmission voltages VDD is recorded in the storage unit 416. FIG. 9 illustrates an example of the table. For example, a printing method using "color mode=monochrome printing" and "print quality=standard" is associated with a power transmission voltage VDD of voltage Va. Similarly, a printing method using "color mode=color printing" and "print quality=fine" is associated with a power transmission voltage VDD of voltage Vb. Such power transmission voltages VDD are voltages such that the Class E amplifier 404 makes a ZVS operation under maximum power consumption estimated to be needed to perform the respective corresponding printing methods (combinations of color modes and print qualities).

Figure 10:
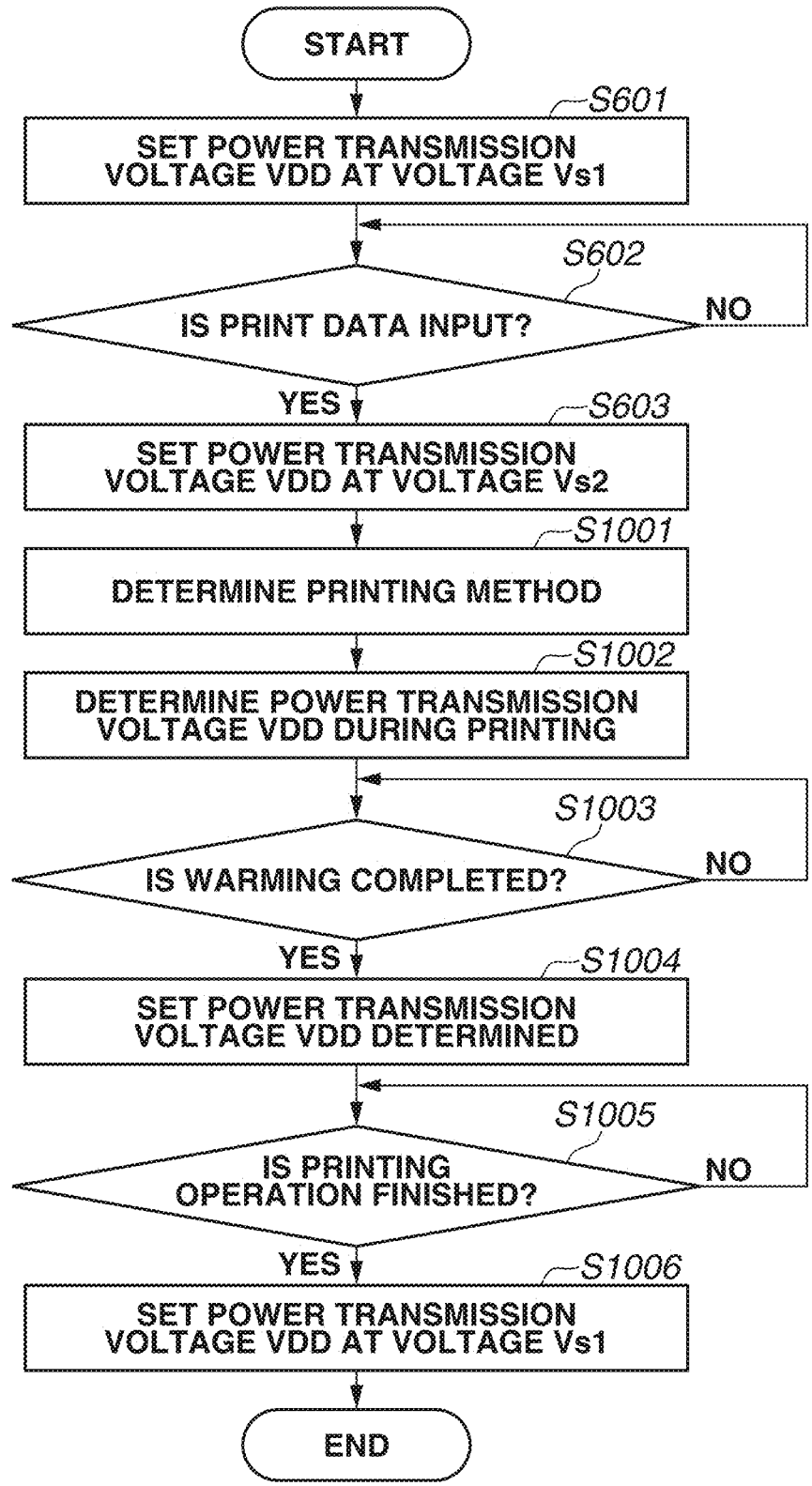
FIG. 10 is an operation flowchart according to the second exemplary embodiment.

An operation of the wireless power transmission system according to the second exemplary embodiment will be described with reference to FIG. 10. In FIG. 10, steps S601 to S603 are similar to those of the first exemplary embodiment (FIG. 6).

In step S1001, the print determination unit 801 determines a printing method (color mode and print quality) specified by the host apparatus via the interface unit 412. Information for specifying the printing method is part of the print data. In step S1002, the power supply control unit 411 determines the power transmission voltage VDD for printing according to the printing method determined in step S1001 and the table (FIG. 9) stored in the storage unit 416. Then, if the warming of the ink head 454 started in step S603 is completed (YES in step S1003), the processing proceeds to a printing operation of steps S1004 and S1005.

In step S1004, the power supply control unit 411 sets the power transmission voltage VDD determined in step S1002. For example, in a case where the color mode is "color printing" and the print quality is "standard", the power supply control unit 411 sets the power transmission voltage VDD at the voltage Vd. In a case where the printing operation related to the print data is finished (YES in step S1005), the processing proceeds to step S1006. In step S1006, the power supply control unit 411 sets the power transmission voltage VDD at the voltage Vs1 again.

As described above, according to the second exemplary embodiment, high-efficiency power transmission in proper quantities is implemented by controlling the power transmission voltage VDD to an optimum value according to the printing method, i.e., the maximum power consumption of the ink head 454.

In the second exemplary embodiment, the power transmission voltage VDD is described to be determined based on the printing method. This configuration is not seen to be limiting. For example, the number of ink droplets to be discharged, described in the first exemplary embodiment, can be combined with the foregoing color modes and print qualities as a condition for determining the power transmission voltage VDD. In such a case, like the first exemplary embodiment, the power transmission voltage VDD can be changed window by window. The number of divisions of printing determined by the power monitor control unit 415 can be combined. In the second exemplary embodiment, the power transmission voltage VDD is determined based on the printing method including the color mode and the print quality. This is not seen to be limiting. For example, the number of colors needed for printing can be used as a condition for determining the power transmission voltage VDD.

In the foregoing exemplary embodiments, the printing apparatus is described using an inkjet printer including an ink head as its recording unit as an example. However, the printing apparatus can be a printer other than an inkjet printer. An apparatus in which a recording unit other than an ink head for discharging ink, i.e., a recording unit that can apply a recording agent other than ink to a print medium is moved by using a carriage is applicable. A recording unit that discharges a liquid for no-printing purposes can be used instead of the ink head.

As described above, according to the foregoing exemplary embodiments, a printing apparatus that provides power to its carriage via wireless power transmission can perform power transmission control based on print data.

One or more functions of the foregoing exemplary embodiments can be implemented by supplying s program to a system or an apparatus via a network or a recording medium, and reading and executing the program by one or more processors of a computer of the system or apparatus. The one or more functions can be implemented by using a circuit that implements one or more of the functions, e.g., an application specific integrated circuit (ASIC).

Other Embodiments

Embodiment(s) can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While exemplary embodiments have been described, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-225373, filed Nov. 18, 2016, which is hereby incorporated by reference herein in its entirety.

What is claimed is:
1. A printing apparatus comprising:
a discharge unit configured to discharge ink onto a print medium for each of a plurality of predetermined areas of an image to be formed based on print data;
a power transmission unit configured to wirelessly supply power to the discharge unit for discharging the ink;
a determination unit configured to determine an amount of ink droplets to be discharged from the discharge unit for each of the plurality of the predetermined areas; and
a setting unit configured to set, before the discharge unit discharges ink to one of the plurality of predetermined areas, an amount of the power to be supplied from the power transmission unit to the discharge unit based on the determined amount of ink droplets to be discharged from the discharge unit for the one of the plurality of predetermined areas.

2. The printing apparatus according to claim 1, further comprising
an estimate unit configured to estimate an amount of power consumption by the discharge unit for each of the plurality of predetermined areas, based on the determined amount of ink droplets to be discharged from the discharge unit for each of the predetermined areas,
wherein the setting unit is configured to set, before the discharging unit discharges ink to one of the plurality of predetermined areas, the amount of the power to be supplied from the power transmission unit to the discharge unit based on the estimated amount of power consumption by the discharge unit for the one of the plurality of predetermined areas.

3. The printing apparatus according to claim 1, wherein the power transmission unit is configured to wirelessly supply power to the discharge unit by using an amplifier which generates an alternating-current voltage by switching a direct-current voltage input to the amplifier, and
wherein the setting unit is configured to set the direct-current voltage input to the amplifier.

4. The printing apparatus according to claim 3,
wherein the amplifier is a Class E amplifier, and
wherein the setting unit is configured to set the direct-current voltage input to the Class E amplifier to achieve zero voltage switching (ZVS) of the Class E amplifier.

5. The printing apparatus according to claim 1, wherein the plurality of predetermined areas are a predetermined number of areas into which an area to be recorded by one scan of the discharge unit is divided in a scanning direction.

6. The printing apparatus according to claim 5, wherein the determination unit is configured to compare the number of ink droplets to be discharged with a threshold and determine whether to perform multi-pass printing in which a printing operation is divided and performed by a plurality of scans, based on a result of the comparing,
wherein the setting unit is configured to, in an area in which the multi-pass printing is to be performed, set the amount of the power to be supplied from the power transmission unit to the discharge unit based on the number of ink droplets in each scan of the multi-pass printing.

7. The printing apparatus according to claim 1, further comprising a storage medium,
wherein the storage medium stores a table containing data on a correspondence between the amount of ink droplets to be discharged and an amount of wirelessly supplied power to be set, and
wherein the setting unit is configured to set the amount of the power to be supplied from the power transmission unit to the discharge unit based on the data stored in the table.

8. The printing apparatus according to claim 1, wherein the setting unit is configured to set the amount of the power to be supplied from the power transmission unit to the discharge unit based on a printing method specified by the print data.

9. The printing apparatus according to claim 8, wherein the printing method includes a color mode indicating whether color printing or monochrome printing is to be performed or a print quality level.

10. The printing apparatus according to claim 9, further comprising a storage medium,
wherein the storage medium stores a table including data on a correspondence between the printing method and amount of wirelessly supplied power to be set, and
wherein the setting unit is configured to set the amount of the power to be supplied from the power transmission unit to the discharge unit based on the data stored in the table.

11. The printing apparatus according to claim 1, wherein the setting unit is configured to set the amount of the power to be supplied from the power transmission unit to the discharge unit based on a number of colors determined based on the print data.

12. The printing apparatus according to claim 1, wherein the setting unit is configured to, before the print data is received, set the amount of the power to be supplied from the power transmission unit to the discharge unit at a power level necessary for a data reception operation.

13. The printing apparatus according to claim 1, wherein the setting unit is configured to, in response to a reception of the print data, set the amount of the power to be transmitted from the power transmission unit to the discharge unit at a power level for warming the discharge unit.

14. A method for controlling a printing apparatus including a discharge unit configured to discharge ink onto a print medium for each of a plurality of predetermined areas of an image to be formed based on print data, and a power transmission unit configured to wirelessly supply power to the discharge unit for discharging the ink, the method comprising:
determining an amount of ink droplets to be discharged from the discharge unit for each of the plurality of the predetermined areas; and
setting, before the discharge unit discharges ink to one of the plurality of predetermined areas, an amount of the power to be supplied from the power transmission unit to the discharge unit based on the determined amount of ink droplets to be discharged from the discharge unit for the one of the plurality of predetermined areas.

15. A non-transitory storage medium storing a program for causing a computer of a printing apparatus to execute a method, the printing apparatus including a discharge unit configured to discharge ink onto a print medium for each of a plurality of predetermined areas of an image to be formed based on print data, and a power transmission unit configured to wirelessly supply power to the discharge unit for discharging the ink, the method comprising:
determining an amount of ink droplets to be discharged from the discharge unit for each of the plurality of the predetermined areas; and
setting, before the discharge unit discharges ink to one of the plurality of predetermined areas, an amount of the power to be supplied from the power transmission unit to the dischargue unit based on the determined amount of ink droplets to be discharged from the discharge unit for the one of the plurality of predetermined area.

* * * * *